US012581679B2

(12) United States Patent
Wang et al.

(10) Patent No.: US 12,581,679 B2
(45) Date of Patent: Mar. 17, 2026

(54) SPLIT-GATE POWER MOS DEVICE AND MANUFACTURING METHOD THEREOF

(71) Applicant: Hangzhou Silicon-Magic Semiconductor Technology Co., Ltd., Hangzhou City (CN)

(72) Inventors: Jiakun Wang, Hangzhou City (CN); Bing Wu, Zhejiang City (CN)

(73) Assignee: SILICON-MAGIC SEMICONDUCTOR TECHNOLOGY (HANGZHOU) CO., LTD., Hangzhou (CN)

( * ) Notice: Subject to any disclaimer, the term of this patent is extended or adjusted under 35 U.S.C. 154(b) by 656 days.

(21) Appl. No.: 17/887,573

(22) Filed: Aug. 15, 2022

(65) Prior Publication Data

US 2023/0065526 A1     Mar. 2, 2023

(30) Foreign Application Priority Data

Aug. 24, 2021     (CN) .......................... 202110975073.2

(51) Int. Cl.
H10D 30/01          (2025.01)
H01L 21/265          (2006.01)
(Continued)

(52) U.S. Cl.
CPC ... H10D 30/0297 (2025.01); H01L 21/26513 (2013.01); H01L 21/266 (2013.01);
(Continued)

(58) Field of Classification Search
CPC .... H10D 64/01; H10D 64/117; H10D 64/518; H10D 64/25257; H10D 62/393;
(Continued)

(56) References Cited

U.S. PATENT DOCUMENTS 11,424,344 B2     8/2022  Wang et al.
2019/0067427 A1*  2/2019  Burke .................. H10D 64/117
(Continued)

FOREIGN PATENT DOCUMENTS

CN     108039369 A     5/2018
CN     110896026 A     3/2020
CN     113241374 A     8/2021

OTHER PUBLICATIONS

Translation of Chinese Office Action for Chinese Patent Application No. 2021109750732, dated Oct. 17, 2024, 16 pages.

*Primary Examiner* — Fazli Erdem

(74) *Attorney, Agent, or Firm* — Westman, Champlin & Koehler, P.A.

(57)          ABSTRACT

Disclosed is a split-gate power MOS device and a manufacturing method thereof. The method comprises: forming a trench in an epitaxial layer on a substrate; forming a first insulation layer on a surface of the epitaxial layer and in the trench; filling a cavity with polycrystalline silicon, performing back-etching; performing spin-coating on the first gate conductor layer to form a second insulation layer; forming a mask on the second insulation layer, removing a portion of the first insulation layer, to expose an upper portion of the trench; forming a gate oxide layer on a sidewall of the upper portion of the trench and the surface of the epitaxial layer; and forming a second gate conductor layer in the upper portion of the trench. According to the present disclosure, voltage withstand and electric leakage between the first gate conductor layer and the second gate conductor layer are reduced.

12 Claims, 9 Drawing Sheets

(51) Int. Cl.
| | |
|---|---|
| *H01L 21/266* | (2006.01) |
| *H10D 30/66* | (2025.01) |
| *H10D 62/17* | (2025.01) |
| *H10D 64/00* | (2025.01) |
| *H10D 64/01* | (2025.01) |

(52) U.S. Cl.
    CPC ......... *H10D 30/668* (2025.01); *H10D 62/393* (2025.01); *H10D 64/01* (2025.01); *H10D 64/117* (2025.01)

(58) Field of Classification Search
    CPC .............. H10D 30/0297; H10D 30/668; H01L 21/26513; H01L 21/266
    USPC ......................................................... 257/330
    See application file for complete search history.

(56) References Cited

U.S. PATENT DOCUMENTS

| | | | | |
|---|---|---|---|---|
| 2019/0378902 A1 * | 12/2019 | Chen | .................. | H10D 30/0297 |
| 2021/0159324 A1 * | 5/2021 | Wang | ................ | H10D 30/0297 |

* cited by examiner

SPLIT-GATE POWER MOS DEVICE AND MANUFACTURING METHOD THEREOF

CROSS-REFERENCE TO RELATED APPLICATIONS

The present application claims priority to Chinese Patent Application No. 202110975073.2, filed on Aug. 24, 2021, entitled, "SPLIT-GATE POWER MOS DEVICE AND MANUFACTURING METHOD THEREOF", and published as CN114156183A on Mar. 8, 2022, the disclosures of which are incorporated herein by reference in their entireties.

FIELD OF TECHNOLOGY

The present disclosure relates to a technical field of power semiconductors, in particular to a split-gate power MOS device and a manufacturing method thereof.

BACKGROUND

Metal-oxide-semiconductor field-effect transistors (MOS-FETs) have been widely used as power semiconductor devices, for example, as switches in power converters.

FIG. 1 shows a split-gate power MOS device, including: a substrate 110, an epitaxial layer 120, a first insulation layer 131, a first gate conductor layer 132, a second gate conductor layer 133, a body region 134, a source region 135, a contact region 136, a dielectric layer 140, a source electrode 141 and a drain electrode 143, wherein the first insulation layer, the first gate conductor layer and the second gate conductor layer are located in a trench of the epitaxial layer 120, the body region, the source region and the contact region are located in the epitaxial layer 120, the dielectric layer 140 and the source electrode are located on the epitaxial layer 120, and the drain electrode is located on a second surface of the substrate 110. The structure in the trench is formed by followings steps: forming the insulation layer on a sidewall and at a bottom of the trench; depositing polycrystalline silicon in a cavity defined by the insulation layer, and performing back-etching process on the polycrystalline silicon to form the first gate conductor layer; depositing the insulation layer on a surface of the first gate conductor layer, and then performing back-etching process on the insulation layer; and finally depositing polycrystalline silicon material to form the second gate conductor layer.

In a process of the prior art, since the insulation layer between the first gate conductor layer and the second gate conductor layer is a portion of the insulation layer remained after back etching process, and the thickness of the insulation layer may not be accurately controlled in the back-etching process, thus under-etching or over-etching may occur, which leads to that the insulation layer between the first gate conductor layer and the second gate conductor layer is too thick or too thin. As a result, the device may have problems on voltage withstand and electric leakage.

SUMMARY

In view of the above problems, an objective of the present disclosure is to provide a split-gate power MOS device and a manufacturing method thereof. By performing a spin-coating process and using a mask layer, during a back-etching process performed on a first insulation layer, it can be ensured that a thickness of a second insulation layer on top of a first gate conductor layer is prevented from being too thin or too thick, thereby relieving problems on voltage withstand and electric leakage between the first gate conductor layer and second gate conductor layer.

According to one aspect of the present disclosure, provided is a manufacturing method of a split-gate power MOS device, wherein the manufacturing method comprises: forming an epitaxial layer of a first doping type on a substrate of the first doping type, and forming a trench in the epitaxial layer; forming a first insulation layer on a surface of the epitaxial layer and in the trench, wherein the first insulation layer covers an inner surface of the trench so that a cavity surrounded by the first insulation layer is formed in the trench; filling the cavity with polycrystalline silicon, performing back-etching process on the polycrystalline silicon, removing a portion of the polycrystalline silicon to form a first gate conductor and expose an upper portion of the cavity; performing a spin-coating process on a surface of the first gate conductor in the cavity to form a second insulation layer; forming a mask on the second insulation layer, removing a portion, which is positioned on the surface of the epitaxial layer and a sidewall of the mask in the trench, of the first insulation layer, to expose an upper portion of the trench; forming a gate oxide layer on a sidewall of the upper portion of the trench and the surface of the epitaxial layer; and forming a second gate conductor in the upper portion of the trench.

In some embodiments, the gate oxide layer is formed by performing a thermal oxidation process.

In some embodiments, after forming the second gate conductor in the upper portion of the trench, the manufacturing method further comprises: forming a body region and a source region at a first surface of the epitaxial layer; forming a dielectric layer on a surface of the gate oxide layer and a surface of the second gate conductor; forming a via hole which penetrates through the dielectric layer, the gate oxide layer and the source region and extends into the body region; through the via hole, forming a contact region in a portion, which is positioned at a bottom of the via hole, of the body region; depositing metal material on the via hole and the dielectric layer to form a first electrode; and forming a second electrode on a second surface of the substrate.

In some embodiments, step of forming the body region and the source region at the first surface of the epitaxial layer comprises: performing ion implantation on the epitaxial layer by using the second gate conductor layer as a mask to form the body region of a second doping type, wherein the second doping type and the first doping type are opposite; and performing ion implantation on the epitaxial layer by using the second gate conductor layer as a mask to form the source region of the first doping type.

In some embodiments, the contact region is of the second doping type.

In some embodiments, the first doping type is N doping type, and the second doping type is P doping type.

According to the other aspect of the present disclosure, provided is a split-gate power MOS device formed by performing the manufacturing method as described above. The split-gate power MOS device comprises: a substrate; an epitaxial layer located on a first surface of the substrate; a trench formed in the epitaxial layer; an insulation layer located in the trench and a first gate conductor surrounded by the insulation layer; a gate oxide layer and a second gate conductor positioned on an upper portion of the insulation layer in the trench, wherein the gate oxide layer is located on a sidewall of an upper portion of the trench and a surface of the epitaxial layer, and the second gate conductor layer is surrounded by the gate oxide layer in the trench; a body region, a source region and a contact region located in a region, adjacent to the trench, of the epitaxial layer, wherein doping types of the body region and the source region are opposite; a dielectric layer located on the gate oxide layer and the second gate conductor layer; and a first electrode, which is located on the dielectric layer and penetrates through the dielectric layer to extend down to the contact region, and a second electrode located on a second surface of the substrate.

According to the manufacturing method of the split-gate power MOS device provided by the present disclosure, after the first gate conductor is formed in the trench, the second insulation layer is formed on top of the first gate conductor by performing spin-coating process, and the mask layer is formed to protect the second insulation layer during an etching process performed on the first insulation layer, thereby preventing the thickness of the second insulation layer from being changed due to the etching process performed on the first insulation layer, solving the problems on voltage withstand and electric leakage which can be brought out when the thickness of the second insulation layer between the first gate conductor layer and the second gate conductor layer is too thick or too thin, and reducing capacitance of the device.

BRIEF DESCRIPTION OF THE DRAWINGS

The above and other objectives, features and advantages of the present disclosure will become more apparent from the description of the embodiments of the present disclosure below with reference to the accompanying drawings, in which.

DETAILED DESCRIPTION OF THE EMBODIMENTS

Figure 1:
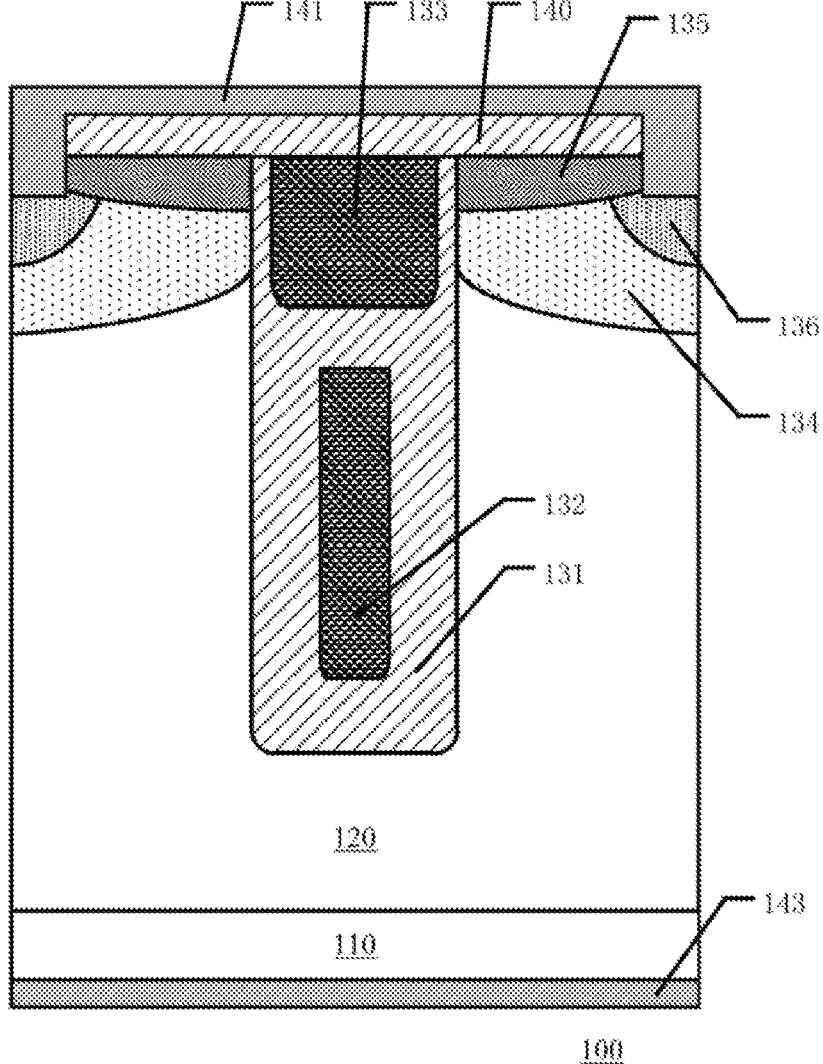
FIG. 1 shows a structural diagram of a split-gate power MOS device according to the prior art.

The present disclosure will be described in more detail below with reference to the accompanying drawings. In each accompanying drawing, the same elements are denoted by the similar reference numerals. For the sake of clarity, each part in the accompanying drawings is not drawn to scale. In addition, some well-known parts may not be shown. For the sake of simplicity, a semiconductor structure obtained after several steps may be described in a drawing.

It should be understood that, during the description of the structure of a device, when a layer or region is referred to as being located "on" or "above" another layer or region, it may be directly located on another layer or region, or other layers or regions are also included between it and another layer or region. Moreover, if the device is turned over, the layer or region will be located "under" or "below" another layer or region.

In order to describe the situation of being directly located on another layer or region, the expression "directly on . . . " or "on and adjacent to . . . " will be adopted herein.

The specific implementation of the present disclosure will be further described in detail below with reference to the accompanying drawings and the embodiments.

Figure 2:
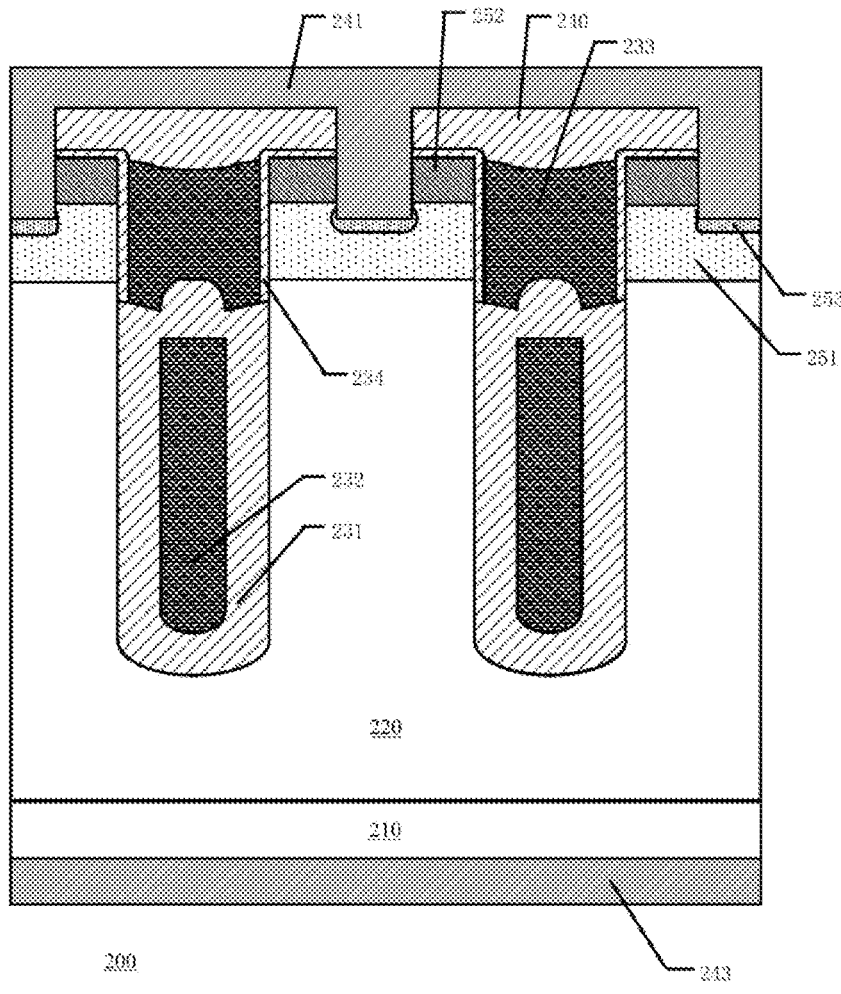
FIG. 2 shows a structural diagram of a split-gate power MOS device according to an embodiment of the present disclosure.

FIG. 2 shows a structural diagram of a split-gate power MOS device according to an embodiment of the present disclosure.

As shown in FIG. 2, the split-gate power MOS device 200 provided by the present disclosure comprises: a substrate 210, an epitaxial layer 220, an insulation layer 231, a first gate conductor layer 232, a second gate conductor layer 233, a gate oxide layer 234, a body region 251, a source region 252, a contact region 253, a dielectric layer 240, a first electrode layer 241 and a second electrode layer 243, wherein the epitaxial layer 220 is located on a first surface of the substrate 210, the insulation layer 231 is located in a trench of the epitaxial layer 220, the first gate conductor layer 232 is surrounded by the insulation layer 231, the second gate conductor layer 233 is located on the insulation layer 231, the gate oxide layer 234 is located between the second gate conductor layer 233 and the epitaxial layer 220, the body region 251, the source region 252 and the contact region 253 are located at a first surface of the epitaxial layer 220, the dielectric layer 240 and the first electrode layer 241 are sequentially located on the first surface of the epitaxial layer 220, and the second electrode layer 243 is located on a second surface of the substrate 210. It should be understood that, in some embodiments, a single trench 202 can be formed in the split-gate power MOS device, and a single insulation layer 231, a single first gate conductor layer 232, a single second gate conductor layer 233, a single gate oxide layer 234, a single body region 251, a single source region 252, a single contact region 253 and a single dielectric layer 240 can be formed based on that single trench 202. In some other embodiments, two or more trenches 202 can be formed in the split-gate power MOS device, so that a corresponding number (i.e., equal to the number of the trenches 202) of insulation layers 231, first gate conductor layers 232, second gate conductor layers 233, gate oxide layers 234, body regions 251, source regions 252, contact regions 253, dielectric layers 240 can be formed based on each of the trenches according to the embodiments of the present disclosure, and the first electrode layer 241 is configured to connect each body region 251 through a corresponding one of the contact regions 253.

In this embodiment, the substrate 210, the epitaxial layer 220 and each source region 252 are of a first doping type, each body region 251 and each contact region 253 are of a second doping type, and the second doping type is opposite to the first doping type. Specifically, the first doping type is N or P doping type, and the second doping type is P or N doping type opposite to the first doping type. In this embodiment, the substrate 210 is of a heavily doped N+ type, the epitaxial layer 220 is of a lightly doped N– type, each body region 251 is of the P doping type, each source region 252 is of the heavily doped N+ type, and each contact region 253 is of a heavily doped P+ type.

In the split-gate power MOS device 200 shown in FIG. 2, the insulation layer 231 has a relatively suitable thickness, and the insulation layer 231 is formed by performing a spin-coating process and can be protected with a mask layer, so that the portion, which is positioned on a corresponding first gate conductor layer 232 in an end device, of each insulation layer 231 can be neither too thick nor too thin, and the end device will not have problems on voltage withstand or electric leakage.

FIGS. 3a-3m show cross-sectional views at stages of a manufacturing method of the split-gate power MOS device according to an embodiment of the present disclosure.

At the beginning, the manufacturing method is performed based on a substrate 210 and an epitaxial layer 220 formed on the substrate 210. The material of the substrate 210 and the epitaxial layer 220 may be silicon but not be limited herein, and are of the first doping type. The doping concentration of the substrate 210 is higher than the epitaxial layer 220.

Figure 3A:
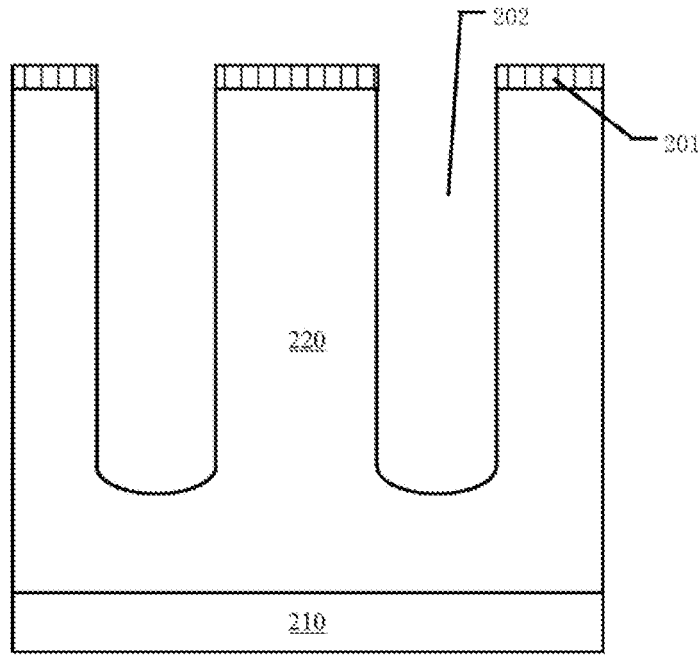
FIGS. 3a-3m show cross-sectional views at stages of a manufacturing method of the split-gate power MOS device according to an embodiment of the present disclosure.

Step 1: a mask layer 201 is formed on a first surface of the epitaxial layer 220, and a trench 202 is formed in the epitaxial layer 220, as shown in FIG. 3*a*. Again, it should be understood that, in some embodiments, two or more trenches 202 can be formed at step 1, and followings steps can be performed based on each of the trenches 202 in accordance with the embodiments of the present disclosure.

In this step, by performing a deposition process, such as a chemical vapor deposition process or a physical vapor deposition process, the patterned mask layer 201 are formed on the first surface of the epitaxial layer 220, and the epitaxial layer 220 is etched by using the patterned mask layer 201 as a mask to form the trench 202 in the epitaxial layer 220. The trench 202 extends from the first surface of the epitaxial layer 220 into the epitaxial layer 220. In this embodiment, for example, by controlling the etching time, the depth of the trench may be controlled.

After forming the trench 202 by etching, the manufacturing method further comprises: removing the mask layer 201.

Figure 3B:
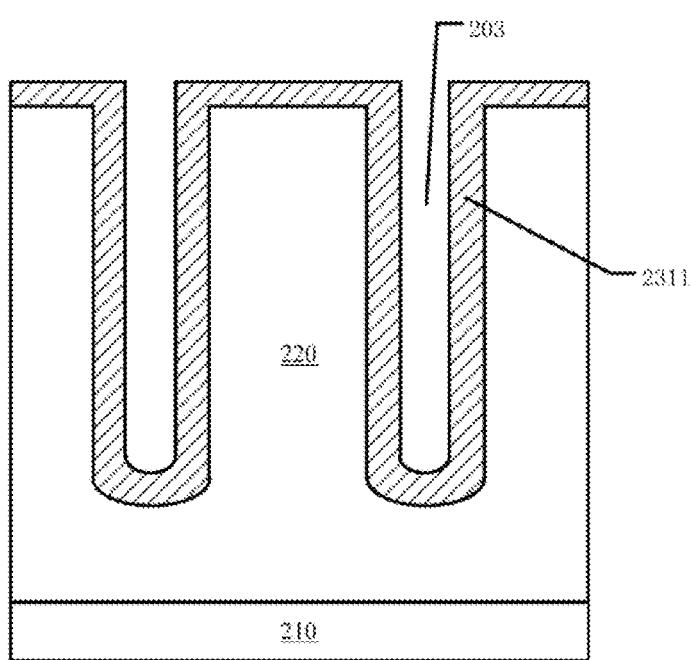

Step 2: a first insulation layer 2311 is formed on a surface of the epitaxial layer 220 and in the trench 202, and the first insulation layer 2311 covers a surface of the trench 202 to form a cavity 203, as shown in FIG. 3*b*.

The first insulation layer 2311 comprises, for example, oxide, such as silicon dioxide. A process for forming the first insulation layer 2311 comprises a thermal oxidation or chemical vapor deposition (CVD) process, or a combination of the thermal oxidation and the chemical vapor deposition process. The thermal oxidation process includes hydrothermal oxidation (HTO) or selective reactive oxidation (SRO) process, and the chemical vapor deposition (CVD) includes low pressure chemical vapor deposition (LPCVD) or subatmospheric chemical vapor deposition (SACVD) process.

The first insulation layer 2311 serves as an isolation layer between the first gate conductor layer 232 and the epitaxial layer 220 in the power semiconductor device. The first insulation layer 2311 covers a sidewall and a bottom surface of the trench 202 and extends on the surface of the epitaxial layer 220, and the cavity 203 is formed after the trench 202 is filled with the first insulation layer 2311.

Figure 3C:
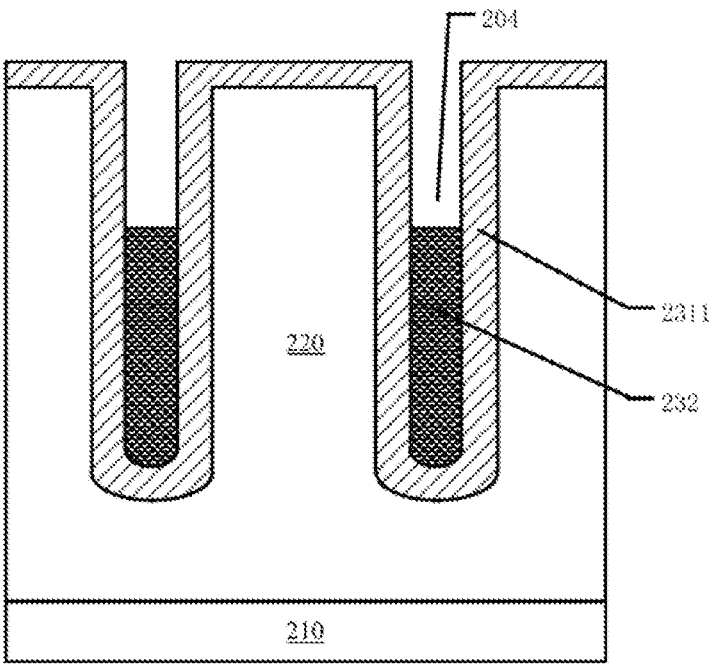

Step 3: the cavity 203 is filled with polycrystalline silicon and a back-etching process is performed to form a first gate conductor layer 232, as shown in FIG. 3*c*.

In this step, a polycrystalline silicon layer is deposited in the cavity 203 by performing a deposition process, then a portion, which is positioned on the surface of the epitaxial layer 220, of the polycrystalline silicon layer is removed by performing a chemical mechanical polishing process, and the polycrystalline silicon layer in the cavity are back-etched by performing a selective wet etching process. In this step, for example, by controlling the etching time, the etching is stopped after the polycrystalline silicon at a predeterminate depth in the cavity is removed, and the remaining portion of the polycrystalline silicon forms, for example, the first gate conductor layer 232.

Figure 3D:
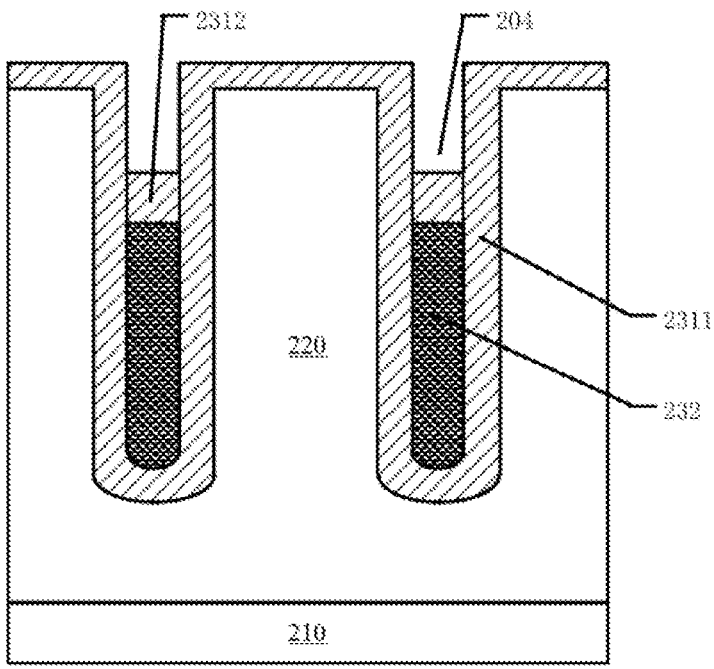

Step 4: a second insulation layer 2312 is formed on the surface of the first gate conductor layer 232 by performing a spin-coating process, as shown in FIG. 3*d*.

In this step, the second insulation layer 2312 is formed on the surface of the first gate conductor layer 232, by performing a spin on glass (SOG) coating process. In the SOG process, liquid solvent containing dielectric material (for example, silicon oxide in this disclosure) uniformly coats the surface of the first gate conductor layer 232 by the spin-coating process, then the solvent is removed by heat treatment, and the dielectric material, which is uniform after a curing process is performed, is left on the surface of the first gate conductor layer 232. Meanwhile, the fluidity of the adopted SOG process ensures that the newly grown second insulation layer 2312 is only located at top of the first gate conductor layer 232. In addition, the amount of the dielectric material contained in the solvent is calculated according to a diameter of the cavity 204 and a predeterminate thickness of the second insulation layer 2312 to be grown, so that the thickness of the second insulation layer 2312 on the surface of the first gate conductor layer 232 may be accurately controlled.

Figure 3E:
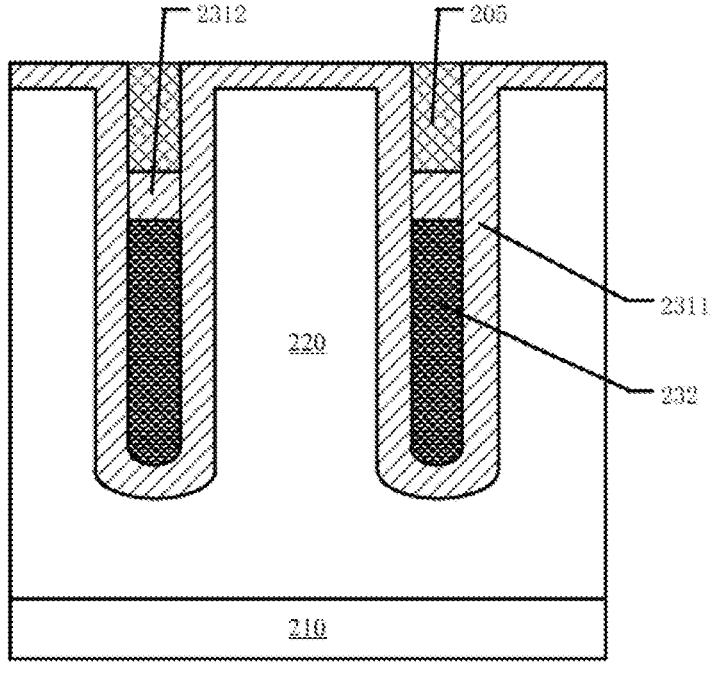
Figure 3F:
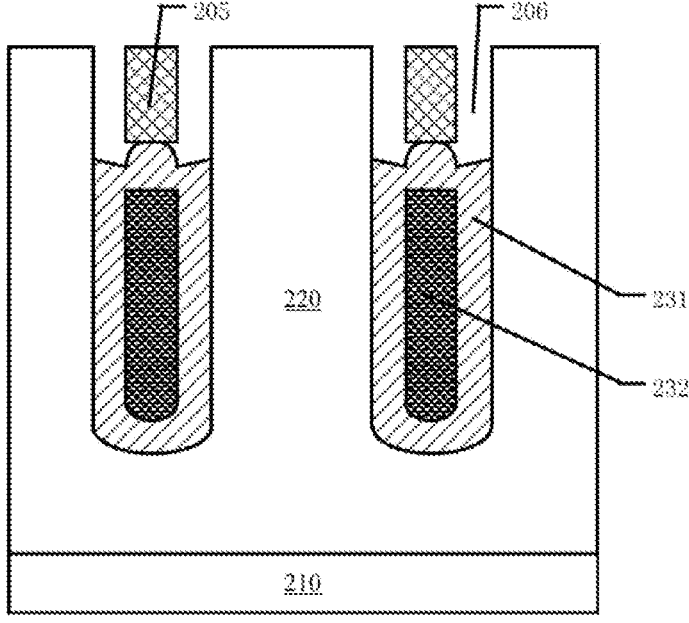

Step 5: a mask 205 is formed in the cavity 204, and a portion of the first insulation layer 2311 is removed through the mask 205 to form a cavity 206, as shown in FIGS. 3*e* and 3*f*.

In this step, the mask 205 is deposited on the first insulation layer 2311 on the surface of the epitaxial layer 220 and in the cavity 204, the mask 205 on a portion, which is positioned on the surface of the epitaxial layer 220, of the first insulation layer 2311, is removed, and only a portion, which is positioned in the cavity 204, of the mask 205 is left. The mask 205 is, for example, photoresist, and the photoresist on the first insulation layer 2311 are removed by chemical mechanical polishing, thereby the surface of the first insulation layer 2311 can be exposed.

Further, a portion, which is positioned on the surface of the epitaxial layer 220, of the first insulation layer 2311 is removed by the mechanical polishing process, then a portion of the first insulation layer 2311 positioned in the trench is back-etched by performing dry etching or wet etching, and by controlling the etching time, the etching can be stopped when a bottom of the mask 205 is exposed.

In this embodiment, since the upper surface of the second insulation layer 2312 can be protected by the mask 205 and the sidewall of the second insulation layer 2312 can be protected by the first insulation layer 2311, the second insulation layer 2312 can only be etched if the portion, which is positioned on the sidewall of the second insulation layer 2312, of the first insulation layer 2311 is etched. However, by controlling the etching time, the etching may be stopped near the surface of the second insulation layer 2312, so that to a certain extent, the portion, which is positioned on the sidewall of the second insulation layer 2312, of the first insulation layer 2311 may be prevented from being etched.

In FIG. 3*f*, for example, a semiconductor structure after the first insulation layer 2311 is back-etched by performing the wet etching process, is shown. Referring to the accompanying drawings, it may be seen that even if a wet etching process, which is difficult to control, is performed, only a small portion of the second insulation layer 2312 may be etched. Therefore, the thickness of the insulation layer above the first gate conductor layer 232 is basically unchanged, so that voltage withstand and electric leakage between the first gate conductor layer 232 and a second gate conductor layer 233 can be reduced. In subsequent steps, the remaining portions of the first insulation layer 2311 and the second insulation layer 2312 are collectively referred to as an insulation layer 231.

In other embodiments, alternatively, if a dry etching process is performed, due to the anisotropy characteristic of dry etching and the protection provided by the mask 205, the second insulation layer 2312 will not be etched. Meanwhile, by controlling the etching time, the back-etching process of the first insulation layer 2311 can be stopped near the upper surface of the second insulation layer 2312.

Figure 3G:
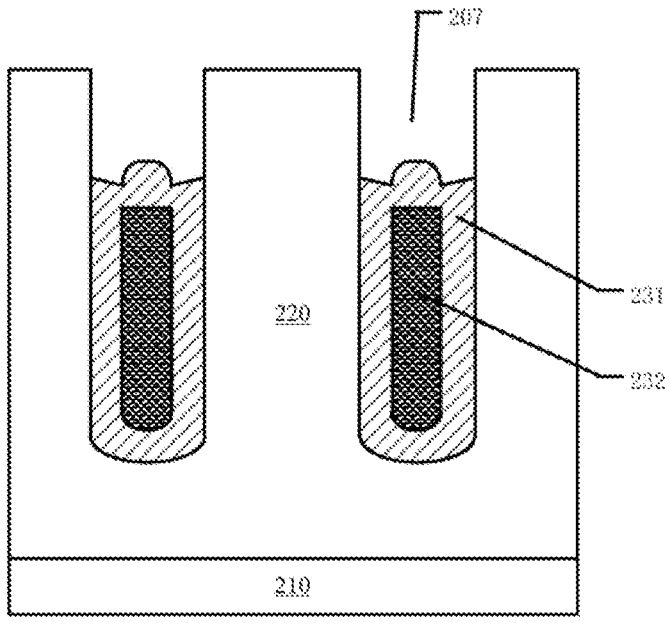
Figure 3H:
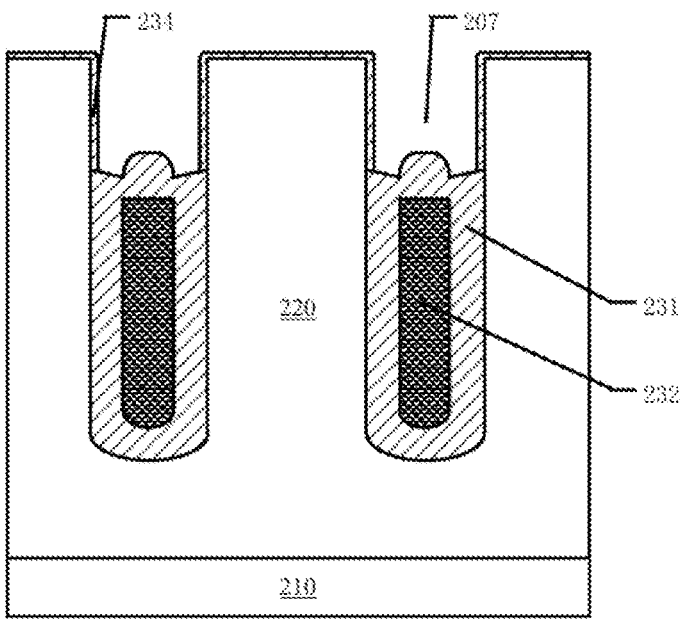

Step 6: the mask 205 is removed, and a gate oxide layer 234 is formed on a sidewall of an upper portion of the trench 207 and the first surface of the epitaxial layer 220, as shown in FIGS. 3g and 3h.

In this step, the mask 205 is removed, thereby a portion, which is positioned on the insulation layer 231, of the trench is exposed. Further, the gate oxide layer 234 is formed on the surface of the epitaxial layer 220 and the sidewall of the portion, which is positioned on the insulation layer 231, of the trench 207, by performing a thermal oxidation process by use of thermal oxidation including hydrothermal oxidation (HTO) or selective reactive oxidation (SRO).

Figure 3I:
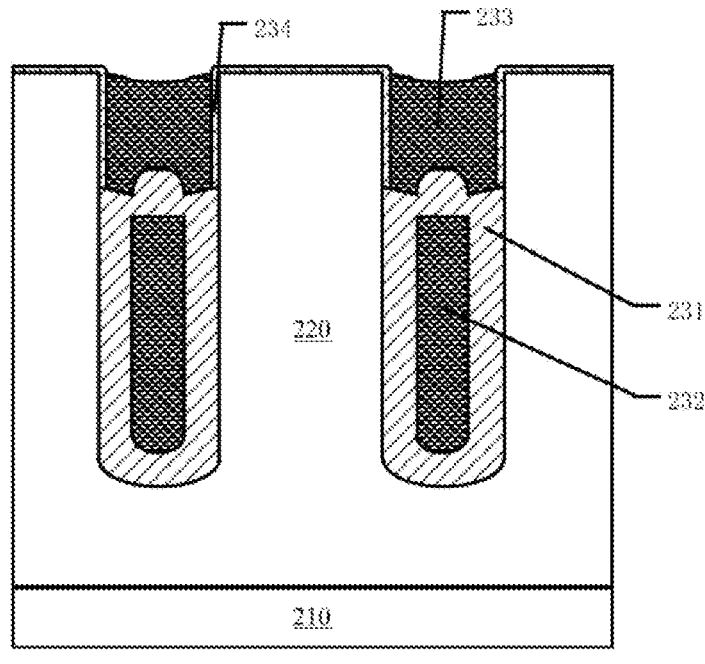

Step 7: polycrystalline silicon is deposited in the trench 207 to form a second gate conductor layer 233, as shown in FIG. 3i.

In this step, the polycrystalline silicon is deposited in the trench 207 by performing deposition process, a portion, which is positioned on the surface of the epitaxial layer 220, of the polycrystalline silicon is removed, and only a portion, which is positioned in the trench 207, of the polycrystalline silicon is left to form the second gate conductor layer 233.

In this embodiment, the second gate conductor layer 233 is isolated from the epitaxial layer 220 by the gate oxide layer 234 and is isolated from the first gate conductor layer 232 by the insulation layer 231. The insulation layer 231 between the first gate conductor layer 232 and the second gate conductor layer 233 is neither too thick nor too thin, thereby relieving the problems on voltage withstand and electric leakage which can be brought out when the thickness of the second insulation layer between the first gate conductor layer 232 and the second gate conductor layer 233 is too thick or too thin.

Figure 3J:
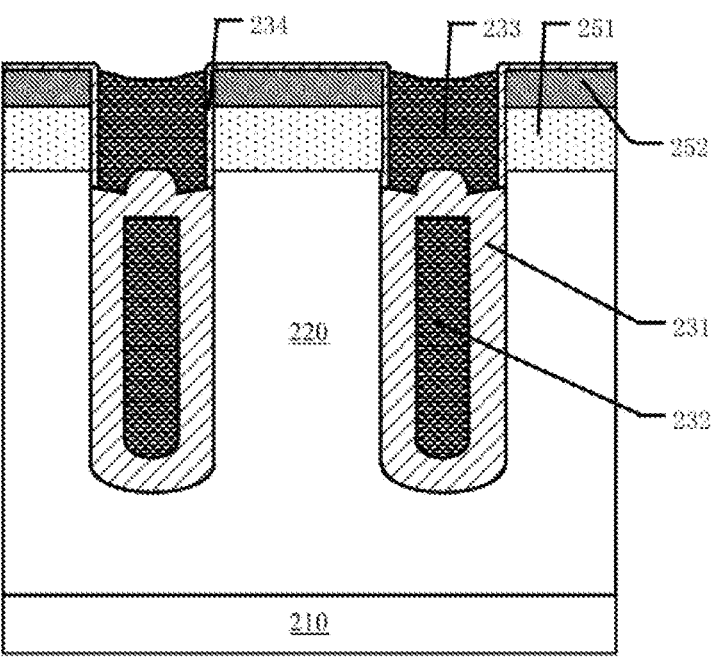

Step 8: a body region 251 and a source region 252 is formed at the first surface of the epitaxial layer 220, as shown in FIG. 3j.

In this step, an ion implantation process is performed to form the body region 251 and the source region 252, and may comprise, for example, multiple ion implantation steps. Appropriate dopants are selected, so that different types of doped regions can be formed, and then thermal annealing is performed to activate impurities. In the ion implantation process, by using the second gate conductor layer 233 as hard mask, transverse positions of the body region 251 and the source region 252 may be defined, so that there's no need to use an additional photoresist mask. Further, the gate oxide layer 234 is located on the first surface of the epitaxial layer 220 and may be used to prevent the first surface of the epitaxial layer 220 from being damaged during the ion implantation process.

Figures 3K, 3L:
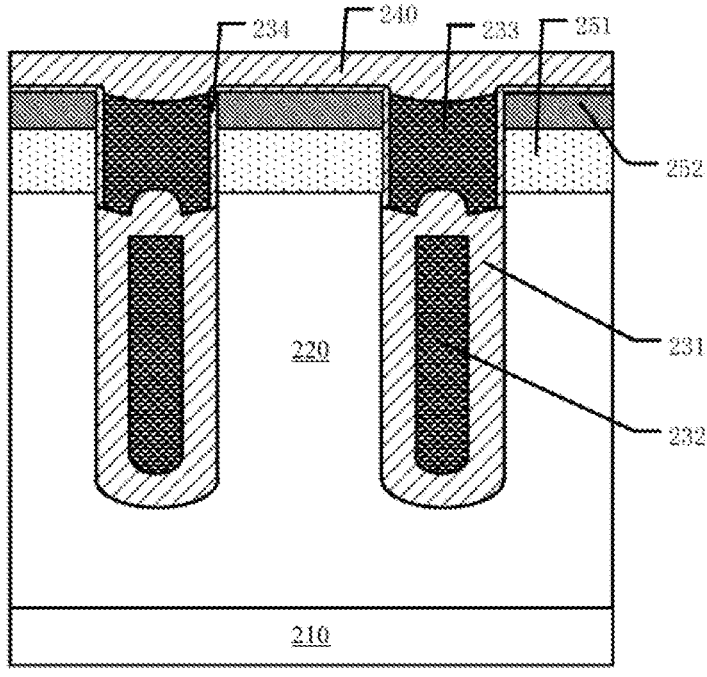

Step 9: a dielectric layer 240 is formed on the surfaces of the gate oxide layer 234 and the second gate conductor layer 233, and a via hole 207 penetrating through the dielectric layer 240, the gate oxide layer 234 and the source region 252 to reach the body region 251 is formed, as shown in FIG. 3k and FIG. 3l.

In this step, the dielectric layer 240 is formed on the surface of the semiconductor structure by performing a deposition process, then the via hole 207 penetrating through the dielectric layer 240 is formed by performing an anisotropic etching process, such as a dry etching process, and meanwhile, the via hole 207 is configured to extend downward and penetrate through the gate oxide layer 234 and the source region 252 to reach the body region 251.

Figure 3M:
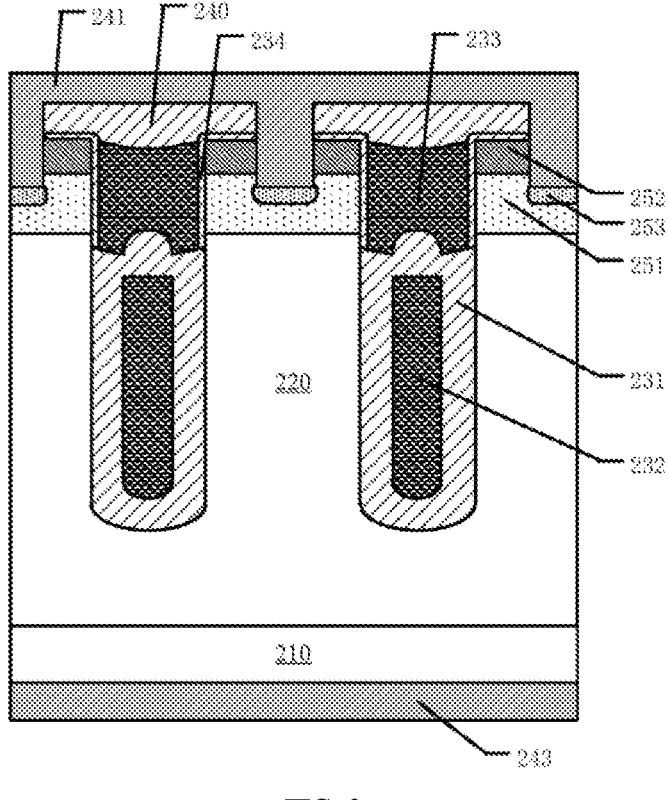

Step 10: a contact region 253 is formed in the body region 251 through the via hole 207, a first electrode layer 241 is formed on the surfaces of the via hole 207 and the dielectric layer 240, and a second electrode layer 243 is formed on a second surface of the substrate 210, as shown in FIG. 3m.

In this step, the contact region 253 is formed in the body region 251 at a bottom of the via hole 207 through the via hole 207, by performing an ion implantation process, and then metal material is deposited on the surfaces of the via hole 207 and the dielectric layer 240 by performing a deposition process, to form the first electrode 241, wherein the first electrode 241 is configured to fill the via hole 207 and is in contact with the contact region 253, and the first electrode 241 serving as a source electrode provides an electrical connection path to the source region 252.

Further, after a front side structure of the split-gate power MOS device 200 is manufactured, the manufacturing method further comprises a step of depositing metal material on a back side of the split-gate power MOS device 200, that is, on the second surface of the substrate 210, to form the second electrode 243. Before the step of forming the second electrode 243, the manufacturing method further comprises a step of thinning the second surface of the substrate 210. In this embodiment, since the substrate 210 is configured to function as a drain region, the second electrode 243 can be in directly contact with the second surface of the substrate 210, and the second electrode serving as a drain electrode may provide an electrical connection path to the drain region.

According to the manufacturing method of the split-gate power MOS device provided by the present disclosure, after the first gate conductor is formed in the trench, the second insulation layer is formed on top of the first gate conductor by performing spin-coating process, and the mask layer is formed to protect the second insulation layer during an etching process performed on the first insulation layer, thereby preventing the thickness of the second insulation layer from being changed due to the etching process performed on the first insulation layer, solving the problems on voltage withstand and electric leakage which can be brought out when the thickness of the second insulation layer between the first gate conductor and the second gate conductor is too thick or too thin, and reducing capacitance of the device.

The embodiments in accordance with the present disclosure, as described above, neither describe all details thoroughly nor limit the present disclosure, and are only the specific embodiments. Apparently, many modifications and variations are possible in light of the above description. These embodiments are selected and specifically described in this description to better explain the principle and practical application of the present disclosure, so that those skilled in the art may make good use of the present disclosure and modifications based on the present disclosure. The present disclosure is to be limited only by the claims and their full scope and equivalents.

What is claimed is:

1. A manufacturing method of a split-gate power metal oxide semiconductor device, comprises:

forming an epitaxial layer of a first doping type on a substrate, and forming a trench in the epitaxial layer;

forming a first insulation layer on a surface of the epitaxial layer and in the trench, wherein the first insulation layer covers an surface of the trench to form a cavity;

filling the cavity with polycrystalline silicon;

performing back-etching process on the polycrystalline silicon, removing a portion of the polycrystalline silicon to form a first gate conductor layer and expose an upper portion of the cavity;

performing spin-coating process on a surface of the first gate conductor layer positioned in the cavity to form a second insulation layer;

forming a mask on the second insulation layer;

removing a portion, which is positioned on the surface of the epitaxial layer and on a sidewall of the mask in the trench, of the first insulation layer, to expose an upper portion of the trench;

forming a gate oxide layer on a sidewall of the upper portion of the trench and the surface of the epitaxial layer; and forming a second gate conductor layer in the upper portion of the trench, wherein a step of performing spin-coating process on the surface of the first gate conductor layer positioned in the cavity to form the second insulation layer comprises: uniformly spinning a liquid solution containing dielectric material onto the surface of the first gate conductor layer, then removing a solvent of the liquid solution by heat treatment;

wherein a thickness of the second insulation layer on the surface of the first gate conductor layer is controlled by an amount of the dielectric material contained in the liquid solution, which is calculated according to a diameter of the cavity and a predeterminate thickness of the second insulation layer.

2. The manufacturing method according to claim 1, wherein the gate oxide layer is formed by performing a thermal oxidation process.

3. The manufacturing method according to claim 1, wherein after forming the second gate conductor layer in the upper portion of the trench, the manufacturing method further comprises:

forming a body region and a source region at a first surface of the epitaxial layer;

forming a dielectric layer on a surface of the gate oxide layer and a surface of the second gate conductor layer;

forming a via hole which penetrates through the dielectric layer, the gate oxide layer and the source region and extends into the body region;

through the via hole, forming a contact region in a portion, which is positioned at a bottom of the via hole, of the body region;

depositing metal material on the via hole and the dielectric layer to form a first electrode; and forming a second electrode on a second surface of the substrate.

4. The manufacturing method according to claim 3, wherein step of forming the body region and the source region at the first surface of the epitaxial layer comprises:

performing ion implantation on the epitaxial layer by using the second gate conductor layer as a mask to form the body region of a second doping type, wherein the second doping type and the first doping type are opposite; and performing ion implantation on the epitaxial layer by using the second gate conductor layer as a mask to form the source region of the first doping type.

5. The manufacturing method according to claim 3, wherein the contact region is of a second doping type.

6. The manufacturing method according to claim 1, wherein the first doping type is N doping type, and the second doping type is a P doping type.

7. A split-gate power MOS device, which is formed by performing the manufacturing method according to claim 1, comprising:

a substrate;

an epitaxial layer located on a first surface of the substrate;

a trench formed in the epitaxial layer;

an insulation layer positioned in the trench and a first gate conductor layer surrounded by the insulation layer;

a gate oxide layer and a second gate conductor layer positioned on an upper portion of the insulation layer in the trench, wherein the gate oxide layer is located on a sidewall of an upper portion of the trench and a surface of the epitaxial layer, and the second gate conductor layer is surrounded by the gate oxide layer in the trench;

a body region, a source region and a contact region located in a region, adjacent to the trench, of the epitaxial layer, wherein doping types of the body region and the source region are opposite;

a dielectric layer located on the gate oxide layer and the second gate conductor layer; and a first electrode, which is located on the dielectric layer and penetrates through the dielectric layer to extend down to the contact region, and a second electrode located on a second surface of the substrate.

8. The split-gate power MOS device according to claim 7, wherein the second gate conductor layer serves as a mask which is used for forming the body region and the source region.

9. The split-gate power MOS device according to claim 7, wherein the contact region and the body region are of a same doping type.

10. The split-gate power MOS device according to claim 7, wherein the body region is of a N doping type, and source region is of a P doping type.

11. The manufacturing method according to claim 1, wherein the spin-coating process is performed with the liquid solution to flow only onto the surface of the first gate conductor layer within the cavity, thereby preventing simultaneous formation of the second insulation layer on any portion of the first insulation layer located above the surface of the epitaxial layer.

12. The manufacturing method according to claim 1, further comprising:

prior to performing said removing the portion of the first insulation layer by using the mask, removing a portion of the first insulation layer and a portion of the mask that are located above the surface of the epitaxial layer by a mechanical polishing process.

* * * * *